United States Patent [19]

Takasu et al.

[11] Patent Number: 4,733,127

[45] Date of Patent: Mar. 22, 1988

[54] UNIT OF ARRAYED LIGHT EMITTING DIODES

[75] Inventors: Hiromi Takasu; Shigeru Sakaguchi, both of Tottori, Japan

[73] Assignees: Sanyo Electric Co., Ltd.; Tottori Sanyo Electric Co., Ltd., both of Japan

[21] Appl. No.: 742,584

[22] Filed: Jun. 7, 1985

[30] Foreign Application Priority Data

Jun. 12, 1984 [JP] Japan .................. 59-121059
Jun. 12, 1984 [JP] Japan .................. 59-121060
Jul. 31, 1984 [JP] Japan .................. 59-162256

[51] Int. Cl.$^4$ .................. H01L 33/00; G09G 3/20; G09G 3/32
[52] U.S. Cl. .................. 313/500; 340/719; 340/754; 340/762; 340/782
[58] Field of Search .................. 313/500, 501; 362/800; 340/701, 702, 703, 718, 719, 753, 754, 762, 782; 357/71; 355/4

[56] References Cited

U.S. PATENT DOCUMENTS

| | | | |
|---|---|---|---|
| 3,315,248 | 4/1967 | Benn et al. .................. | 340/719 |
| 3,536,830 | 10/1970 | Hakki .................. | 340/719 X |
| 3,967,893 | 7/1976 | Majewicz .................. | 355/4 |
| 4,259,679 | 3/1981 | Knibb et al. .................. | 357/71 X |
| 4,445,132 | 4/1984 | Ichikawa et al. .................. | 313/500 X |
| 4,480,261 | 10/1984 | Hattori et al. .................. | 357/71 |

Primary Examiner—David K. Moore
Assistant Examiner—Sandra L. O'Shea
Attorney, Agent, or Firm—Darby & Darby

[57] ABSTRACT

A unit of arrayed light emitting diodes in accordance with the present invention is formed in a manner in which gold paste or the like is applied by screen printing on a substrate (11) to form an elongate printed conductor (12) having a thickness of less than 40 μm, on which light emitting diode arrays (14) having a large number of light emitting areas (5) are disposed. The elongate printed conductor (12) comprises a plurality of printed thick films (121, 122 and 123), the lowermost thick film (121) for example being of a thickness of 10 μm or less, so that both longer side edges of the thick film (121) may have good linearity. Accordingly, using the parallel longer side edges of the elongate printed conductor (12) as reference lines, a plurality of light emitting diode arrays (14) can be disposed with good linearity. In addition, by decreasing a resistance value per unit length of the elongate printed conductor (12) to 1.1 mΩ/mm or less, the current capacity can be increased and the resistance can be lowered.

3 Claims, 14 Drawing Figures

UNIT OF ARRAYED LIGHT EMITTING DIODES

BACKGROUND OF THE INVENTION

1. Field of the Invention

The present invention relates to a unit of arrayed light emitting diodes. More particularly, the present invention relates to a unit of a large number of light emitting diode arrays on a substrate to be utilized in an optical printer head and the like.

2. Description of the Prior Art

As an optical printer using light emitting diode arrays as a light source, U.S. Pat. No. 3,850,517 to Joseph F. Stephany, entitled "High Speed Printout System" is known. Further, as light emitting diode arrays to be used for such an optical printer, U.S. Pat. No. 3,967,893 to Edward John Majewicz, entitled "Light Emitting Device" and Japanese patent Laying-Open Gazette No. 125878/1983 "Light Emitting Device Fixing Substrate" invented by Takeshi Mizutani et al are known.

The "Light Emitting Device" of U.S. Pat. No. 3,967,893 discloses that a drive circuit for enabling a large number of light emitting diode arrays on a substrate is disposed outside the substrate where the light emitting diode arrays are placed.

FIG. 1A is a perspective view showing an appearance of an example of a conventional light emitting device using a "light emitting device fixing substrate" in Japanese patent Laying-Open No. 125878/1983, and FIG. 1B is a view showing an arrangement of the light emitting diode arrays shown in FIG. 1A.

Referring to FIG. 1A, a light emitting device to be used in a conventional optical printer head will be described. The light emitting device 1 is constructed by arranging on a substrate 2 a large number of light emitting diode arrays 4 having light emitting areas 3. Each of the light emitting diode array 4 is connected to a fine pattern 6 formed adjacent to each light emitting diode by metallic fine wire.

If an optical printer head comprises the light emitting device 1 thus formed and characters and the like are printed on printing paper of the A4 size using this optical printer head, the effective printing length needs be as long as 214 mm, and if characters are printed on printing paper of the A2 size, the effective printing length needs be as long as 430 mm. However, since it is impossible to manufacture a light emitting diode array having such length, in order to meet the condition of such effective length, it is necessary to arrange a large number of light emitting diode arrays 4 on the substrate 2.

In order to improve the resolution of the printed letters or picture, it is necessary to make small and equal the dot pitches of printing, that is, the intervals of the light emitting areas 3. To obtain a resolution of 8 to 25 dots for 1 mm, the light emitting areas 3 on the surfaces of the light emitting diode arrays 4 need be arranged with a pitch of 0.125 to 0.04 mm. Such pitch must be invariably equal not only on the surfaces of the light emitting diode arrays 4 but also in the connection points of the light emitting diode arrays 4 so as not to deteriorate the quality of printing of an optical printer. Further, if a disorder occurs in the arrangement with such small intervals of a large number of light emitting areas 3, or light emitting diode arrays 4 on the substrate 2, the linearity in printing will be disturbed, causing an inferior quality of printing.

Therefore, in order to maintain a good quality of printing, it is necessary, as shown in FIG. 1B, to decrease a deviation T from the center line (a) over the whole length L to $\pm 100$ $\mu$m or less irrespective of the effective length, and to decrease to $+10$ $\mu$m or less the maximum distance (deviation) t between the center lines of the respective two adjacent light emitting diode arrays.

To arrange light emitting diode arrays 4 on the substrate at the above stated dot pitches with such precision, it is necessary to use a magnifier. However, the range of vision of a magnifier utilized for keeping the above state precision is 15 mm at most and if an optical printer head having an effective printing length of 214 mm to 430 mm as described above is utilized, the light emitting diode arrays 4 cannot be arranged in a straight line, causing sinuosity as a whole. Further, even if a pattern identifying device is utilized to automatically arrange light emitting diode arrays 4 on the substrate 2, it is extremely difficult to arrange a large number of light emitting diode arrays 4 on the substrate 2 by checking the linearity along the total length with predetermined dot pitches being maintained.

In consequence, a method for arranging light emitting diode arrays 4 in grooves 7 formed in the substrate 2 shown in FIG. 1A may be considered. However, it is also extremely difficult to form elongate grooves of 1 to 2 mm in width almost coincident with the light emitting diode arrays 4. More specifically, if elongate grooves 7 are formed in the substrate 2 by a mechanical method, the linearity cannot be maintained with good precision and if the grooves are formed by etching or other similar method, it is difficult to make plane the bottom surfaces of the grooves 7, causing inconvenience such as inclination of the surfaces of the light emitting diode arrays 4.

SUMMARY OF THE INVENTION

Therefore, a principal object of the present invention is to provide a unit of arrayed light emitting diodes which can be easily positioned by using as reference lines the longer side edges of an elongate printed conductor, whereby characters and the like can be printed with good quality by light emission of the light emitting diode array.

Briefly stated, the present invention comprises at least one light emitting diode array disposed on an elongate printed conductor having at least a printed thick film of a thickness of 10 $\mu$m or less formed on a substrate.

Consequently, according to the present invention, a light emitting diode array can be disposed on an elongate printing conductor by using as reference lines the edges of both longer sides of the elongate printed conductor. As a result, the light emitting diode array can be arranged with good linearity and accordingly characters and the like can be printed with good linearity. Thus, the quality of printing can be improved.

In a preferred embodiment of the present invention, an elongate printed conductor is comprised of a plurality of layers, at least one of the layer having a thickness of less than 10 $\mu$m and the thickness of the elongate printed conductor being less than 40 $\mu$m, with a resistance value per unit length being 1.1 m$\Omega$/mm or less, more preferably, less than 0.9 m$\Omega$/mm, so that a plurality of light emitting diode arrays are arranged with good precision on the elongate printed conductor.

Thus, if with a resistance value of 0.9 m$\Omega$/mm to 1.1 m$\Omega$/mm per unit length, light emitting diode arrays having high luminance are selected to be disposed in the central portion of an elongate printed conductor, inequality in the luminance distribution can be avoided even if the luminance of the light emitting diode arrays in the central portion is lowered due to a voltage drop caused by the elongate printed conductor. In addition, if an elongate printed conductor is formed with a resistance value of less than 0.9 mΩ/mm per unit length, a voltage drop across the elongate printed conductor can be decreased and, as a result, inequality in the luminance distribution can be reduced even if light emitting diode arrays having specially high luminance are not disposed in the central portion.

Further, in a preferred embodiment of the present invention, a fine pattern having a density of 4 to 13 lines for 1 mm are provided near the peripheries of an elongate printed conductor so as to be connected with light emitting diode arrays. The fine patterns are formed together with the lowermost layer out of the plurality of layers of the elongate printed conductor.

Further, in another preferred embodiment of the present invention, an elongate printed conductor having at least one printed thick film of a thickness of less than 10 μm is formed on a substrate and on the elongate printed conductor at least one light emitting diode array is disposed, a fine pattern having a density of 4 to 13 lines for 1 mm to be connected with the light emitting diode array being formed in the vicinity of the elongate printed conductor. In addition, a multilayer connection is formed on the substrate, distant from the elongate printed conductor.

Thus, fine patterns are formed in the vicinity of the elongate printed conductor and a multilayer connection is formed only in the peripheral portions of the substrate, and, as a result, radiation characteristics in the fine patterns will never be deteriorated.

In a further preferred embodiment of the invention, drive devices are provided between the elongate printed conductor and the multilayer connection so as to enable the light emitting diode array. The multilayer connection including a common connection and a signal providing terminal is connected to the drive devices and the drive devices are connected to the light emitting diode array through the fine patterns and, as a result, it is made unnecessary to provide a terminal for applying a signal for each light emitting diode array, whereby the number of terminals can be decreased.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1A:
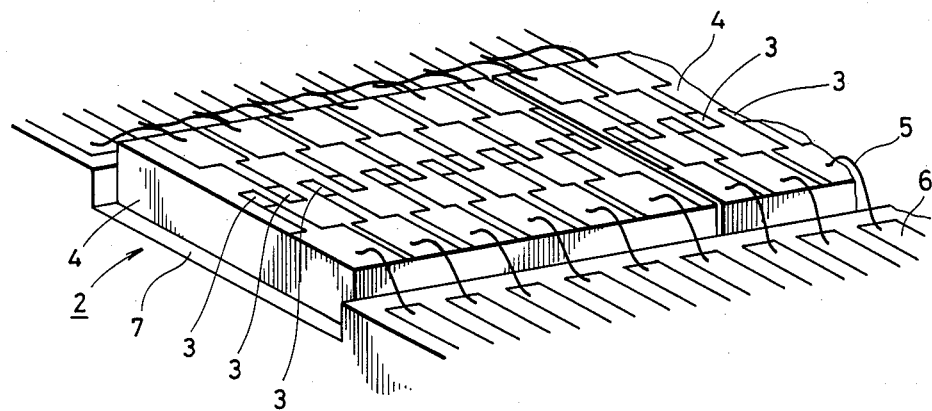
FIG. 1A is a perspective view of an essential portion of an optical printer head where a conventional unit of arrayed light emitting diodes is provided.
Figure 1B:
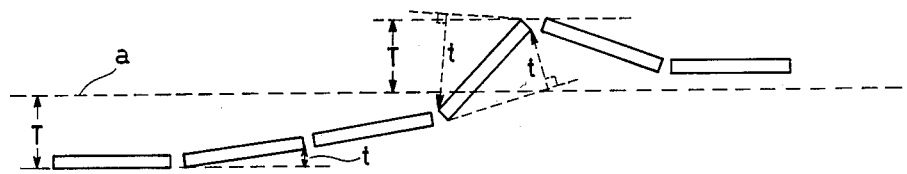
FIG. 1B is a view showing an arrangement of the light emitting diode arrays shown in FIG. 1A.
Figure 2:
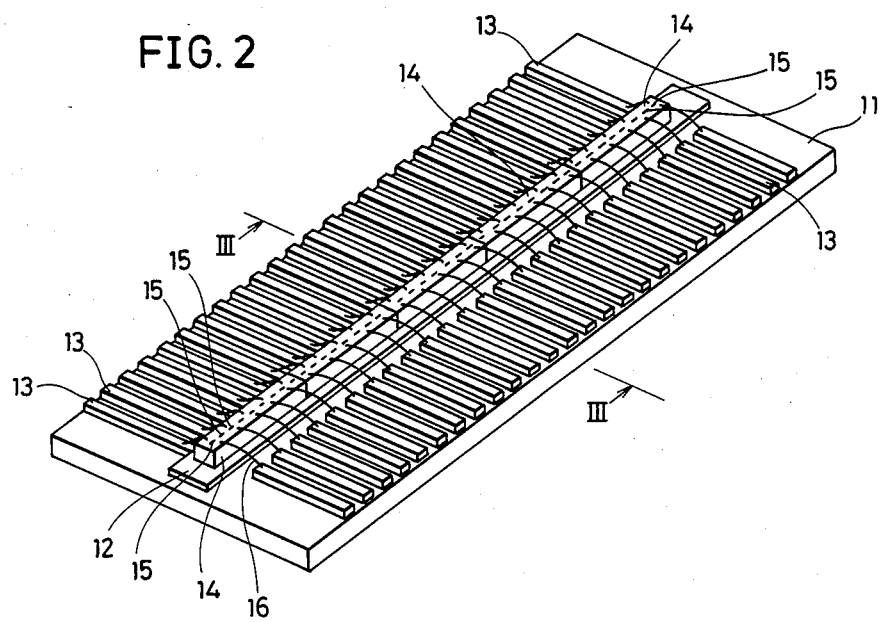
FIG. 2 is a perspective view showing an appearance of an embodiment of the present invention.
Figure 3:
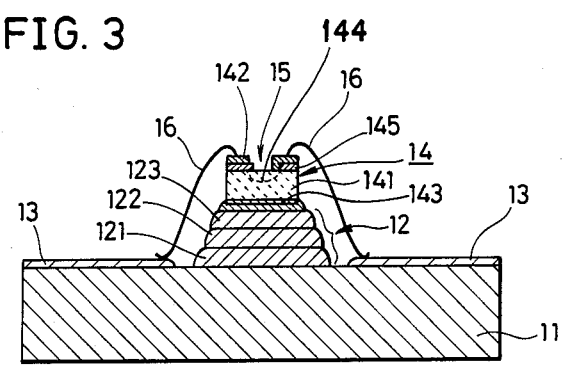
FIG. 3 is a cross-sectional view taken along the line III—III of FIG. 2.

FIG. 2 is a perspective view showing an appearance of an embodiment of the present invention and FIG. 3 is a cross-sectional view taken along the line III—III of FIG. 2.

First, referring to FIGS. 2 and 3, the construction of an embodiment of the present invention will be described. On a substrate 11, an elongate printed conductor 12 is formed. This elongate printed conductor 12 serves to position oppositely a plurality of light emitting diode arrays 14, the edges on both longer sides of the conductor 12 formed as parallel straight lines being used as reference lines for positioning the plurality of light emitting diode arrays 14. If a unit of light emitting diode arrays in this embodiment is used in an optical printer head for printing characters and the like on printing paper of the A4 size, the elongate printed conductor is formed to have a width of 1.4 mm and a length of 220 mm for example.

The light emitting diode arrays 14 include a plurality of light emitting areas 15. More specifically, a light emitting diode arrays 14 having a length of 8 mm, for example, on the front surface of the GaAsP layer 141, 64 PN junctions 144 as light emitting areas 15 each having the same size are formed linearly at equal intervals by a selective diffusion method. The light emitting areas 15 form dots for printing so that they are enabled independently of each other to be turned on. On the back surface of the GaAsP layer 141, back surface electrodes 143 are formed and on the front surface of the GaAsP layer 141 an insulating layer 145 is formed to surround the diffusion layer. On the insulating layer 145, front surface electrodes 142 are formed to be in contact with the P regions of the PN junctions.

In the vicinity of the elongate printed conductor 12, fine patterns 13 are formed and these fine patterns 13 are connected with the front surface electrodes 142 of the light emitting diode arrays 14 by means of metallic fine wires 16 by a wire bonding method or the like.

In the following, the elongate printed conductor 12 for positioning the light emitting diode arrays 14 in the above described construction as well as a manufacturing method thereof will be more specifically described. First, on an insulating substrate 11 of ceramics having a thickness of 1 mm, conductive paste is printed by a screen printing method. The conductive paste used in this embodiment is for example PR-114G produced by Tanaka Masusei Co., Ltd., which comprises binding glass of low melting point and extensible gold as a conductive material. After the screen printing, drying and baking processes are applied. In these processes, deformation (paste lay down) will easily occur if the printed paste has a large thickness. Particularly, if at the time of forming fine patterns 13 in the vicinity of the elongate printed conductor 12, a relatively large spacing is given between the elongate printed conductor 12 and the fine patterns 13 for the purpose of preventing deformation, the metallic fine wires 16 are required to be long, which sometimes causes accidents by contact or short circuit.

Accordingly, for formation of the elongate printed conductor 12, a plurality of thick films each having a thickness of 10 μm or less, which cannot be easily deformed, are placed one upon another by printing, the widths of the respective films being decreased gradually in the upward direction. More specifically, the first thick film 121 having a thickness of 10 μm or less is first dried and baked on the substrate 11 and then the second and third thick films 122 and 123 are formed thereon successively by screen printing. Since there is a fear of deformation if the total thickness of the elongate printed conductor 12 exceeds 40 μm in spite of each of the thick films 121 to 123 having a thickness of 10 μm or less, it is desirable to make the total thickness of the conductor 12 be 40 μm or less. Formation of the conductor 12 by evaporation instead of screen printing is not preferred because thick films obtained by evaporation cannot sufficiently lower a resistance value and the surfaces of such films have luster to cause errors in identification at the time of arranging light emitting diode arrays 14 on the conductor 12 using optical identifying means. Therefore, screen printing is the most preferable method.

Figure 4:
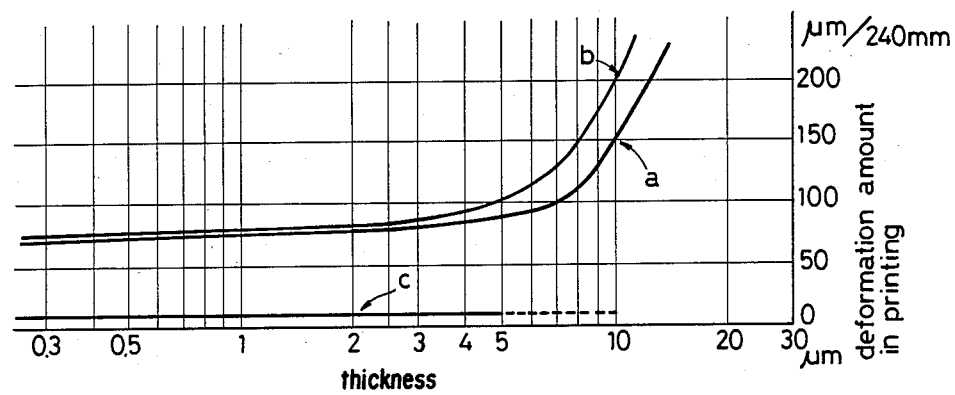
FIG. 4 is a graph showing the relation between a thickness of a conductive pattern and a deformation amount in printing.

FIG. 4 is a graph showing the relation between a thickness of the elongate printed conductor 12 and a deformation amount in printing in this embodiment. Referring to FIG. 4, the line a represents experimental values of the thickness of the thick layer 121, 122 and 123 and the deformation amount in printing when the thick layer 121 of the elongate printed conductor 12 is formed on the substrate 11 by screen printing, while the line b represents maximum values. As is clear from FIG. 4, it is necessary to make the thick layer 121 have a thickness smaller than 10 μm so as to decrease a deformation amount for one printing operation to less than 200 μm/240 mm. To decrease the deformation amount in printing to less than 100 μm/240 mm, it is necessary to make the thickness of the thick layer 121 smaller than 5 μm. However, if the thickness of the thick layer 121 is made smaller than 0.3 μm, cutting would occur in the patterns and, therefore, the thickness of the thick layer 121 is preferably in a range from 0.3 μm to 10 μm and more preferably in a range from 0.3 μm to 5 μm.

Figure 5:
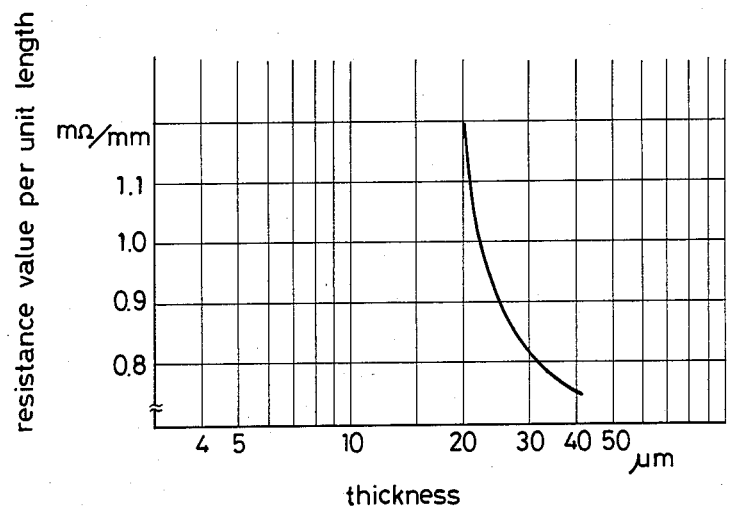
FIG. 5 is a graph showing the relation between a thickness of a conductive pattern and a resistance value per unit length.
Figure 6:
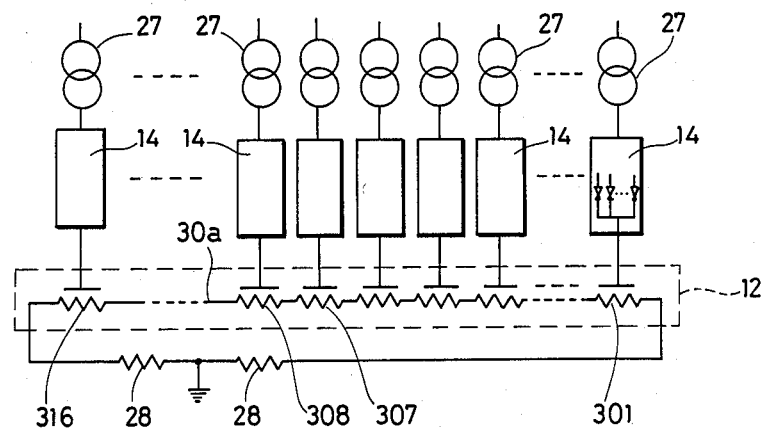
FIG. 6 is an equivalent circuit diagram at the time when light emitting diode arrays are enabled.

FIG. 5 is a graph showing the relation between a thickness of the elongate printed conductor 12 and a resistance value per unit length thereof in an embodiment of the present invention; FIG. 6 is an equivalent circuit diagram at the time of enabling the unit of arrayed light emitting diodes, and FIGS. 7 and 8 are graphs for explaining voltage drop in the elongate printed conductor 12.

An equivalent circuit for driving the unit of arrayed light emitting diodes as shown in FIG. 2 can be represented as in FIG. 6. More specifically, referring to FIG. 6, the light emitting diode arrays 14 are connected respectively with electric current sources 27 and the current value is assumed to be I [A] for example. The elongate printed conductor 12 is represented as a distribution constant circuit and resistors 301 to 307 and resistors 308 to 316 are represented respectively as being connected in series. Assuming that power supply paths 28 are formed by lead wires of a sufficiently low resistance value extending from both ends of the elongate conductor 12, that a resistance value of each of the resistors 301 to 307 and 308 to 316 corresponding to the respective light emitting diode arrays is $R\Omega$ and that the number of light emitting diode arrays 14 utilized is 16 in total, the resistance value from the center 30a to either end of the elongate printed conductor 12 is 8 $R\Omega$. However, in the light emitting diode arrays 14 near the center, a voltage drop of a value larger than $1 \times 8R$ [V] is caused. More specifically, if an electric current of I [A] flows in each of the light emitting diode arrays 14, electric current of 8I [A] flows in the elongate printed conductor 12 under the light emitting diode arrays 14 positioned at the end portions.

Accordingly, as for the voltage drop in the elongate printed conductor 12, the voltage drop in the light emitting diode array 14 most close to the center has a value: $1 \cdot R + 2I \cdot R \cdot 3I \cdot R + \ldots + 8I \cdot R = 36TR$ [V]. For example, with the conditions of I=0.5A as the electric current for each light emitting diode array 14 and R=0.03$\Omega$ as a distributed resistance value in the elongate printed conductor 12, the value of the voltage drop becomes 0.54 V, which cannot be disregarded with respect to the forward voltage drop 1.75 V ±0.05 V in the light emitting diode arrays 14, resulting in lowering of the luminance of the emitted light.

Figure 7:
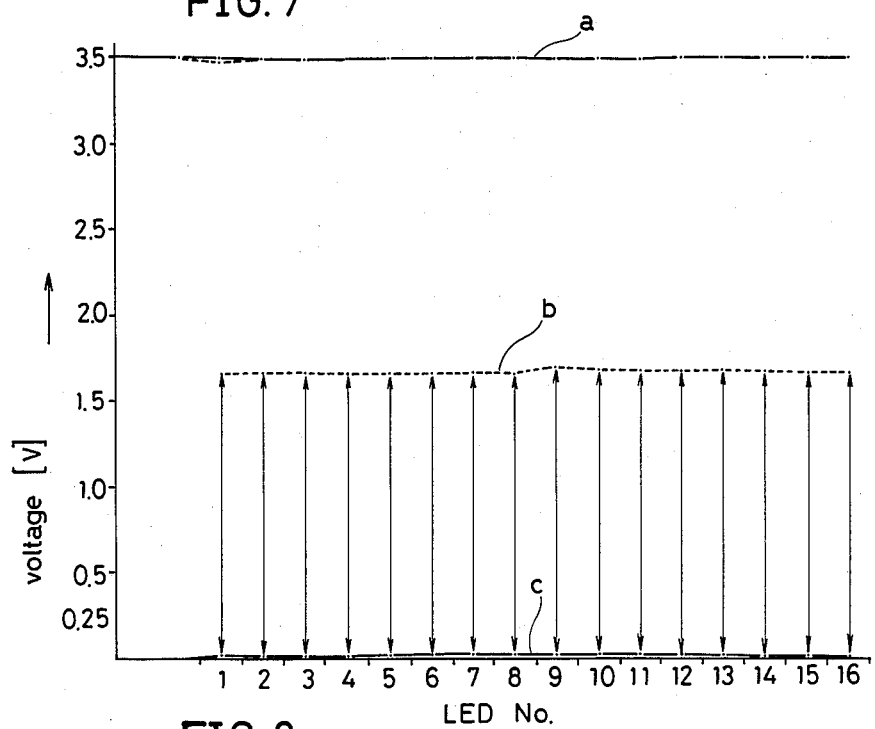
FIGS. 7 and 8 are graphs for explaining a voltage drop in the light emitting diode arrays.
Figure 8:
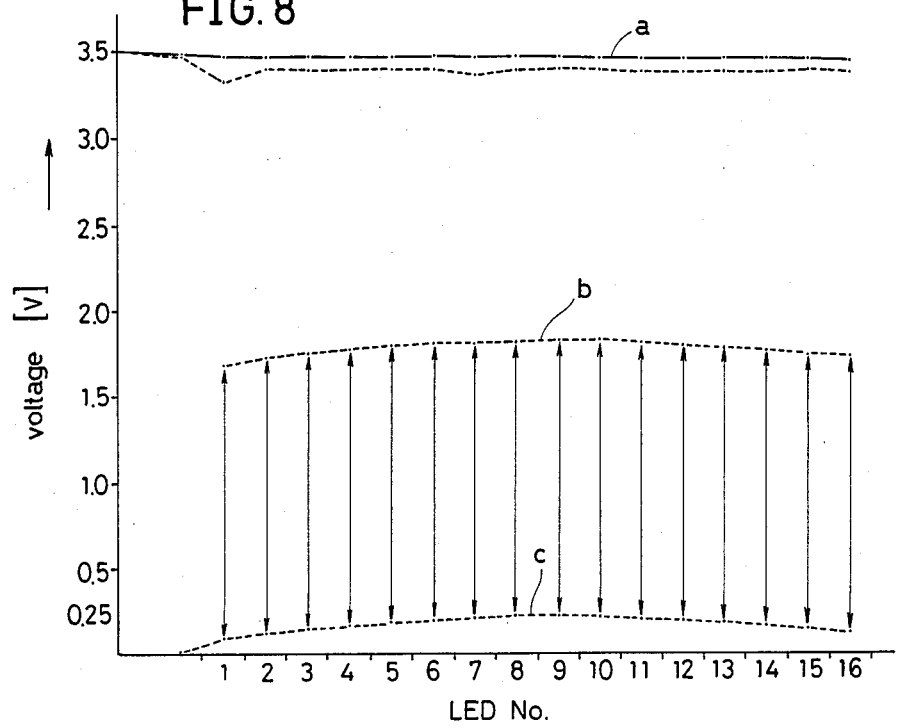

The above stated lowering of the luminance due to the voltage drop was ascertained by experiments as shown in FIGS. 7 and 8.

FIG. 7 represents distribution of the voltage applied to the respective light emitting diode arrays 14 at the time of enabling the 16 light emitting diode arrays 14 with the power supply voltage $V_{DD}=3.5$ V, a ratio of the number of the light emitting portions turned on to the number of the light emitting portions turned off, namely a black ratio, of 10% and a duty ratio of 100%. FIG. 8 represents distribution of the voltage applied to the 16 light emitting diode arrays 14 at the time of enabling the light emitting diode arrays 14 with a black ratio of 100% and a duty ratio of 100%. In FIGS. 7 and 8, the chained line a represents a power supply voltage $V_{DD}$ and the broken lines b represent a potential on the anode side of the light emitting portions 15 and broken lines C represent a potential on the cathode side of the light emitting areas 15, respectively, with regard to the voltage applied to the drive devices. Accordingly, the voltage applied to the respective light emitting areas 15 of the light emitting diode arrays 14 is equal to a difference between the potential of the anode side and the potential of the cathode side, as shown by the arrows in the figures.

From FIGS. 7 and 8, it can be seen that the value of a voltage drop becomes gradually large from both ends of the elongate printed conductor 12 toward the central portion. Consequently, the luminance at the time of enabling a small number of light emitting diode arrays 14 is greatly different fro, the luminance at the time of enabling a large number of light emitting diode arrays 14, which causes deterioration in the quality of printing. In order to decrease such change in luminance due to the voltage drop, it is necessary to make as small as possible the resistance value per unit length of the elongate printed conductor 12. For the purpose of making small the resistance value per unit length of the elongate printed conductor 12, since the width cannot be increased as described above the thickness of the elongate printed conductor 12 needs to be increased. The relation between the resistance value per unit length of the elongate printed conductor 12 and the thickness thereof is shown in FIG. 5.

As can be seen from FIG. 5, the resistance value becomes lowered as the total thickness of the elongate printed conductor 12 increases. However, with the thickness of the elongate printed conductor 12 larger than 40 μm, deformation will be liable to occur due to cracks or baking, causing the total deformation amount to attain 200 μm or more. On the other hand, if the thickness of each of the thick layers 121 to 123 is made smaller than 10 μm for the purpose of decreasing deformation of the thick layers 121, 122 and 123 as described previously, it becomes necessary to repeat the screen printing process many times. If the total thickness of the elongate printed conductor 12 is made smaller than 20 μm, the resistance value per unit length is larger than 1.1 mΩ/mm and the voltage drop is remarkably increased. As a result, it is preferable to set the total thickness of the elongate printed conductor 12 within a range from 20 μm to 40 μm and to set the resistance value per unit length to 1.1 mΩ/mm or less.

Although a voltage drop occurs if the resistance value per unit length is 1.1 mΩ/mm, the luminance is not lowered substantially if light emitting diode arrays 14 having high luminance are selected to be positioned in the central portion of the elongate printed conductor 12. If such light emitting diode arrays 14 having high luminance are not particularly selected, the resistance value per unit length has only to be 0.9 mΩ/mm or less and in this case, the thickness of the elongate printed conductor 12 is made 25 μm or more if a gold paste is used.

Figure 9:
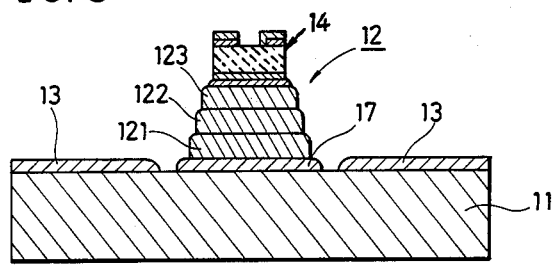
FIG. 9 is a cross-sectional view of another embodiment of the present invention.

FIG. 9 is a cross-sectional view of another embodiment of the present invention. In the embodiment shown in FIG. 9, a gold paste of a thickness of 3 μm for example is applied by screen printing on the whole surface of the substrate 11 before formation of the elongate printed conductor 12 and, after that, by etching a conductor layer 17 and fine patterns 13 are formed at the same time. Then, the above stated thick layers 121 to 123 shown in FIG. 3 are formed on the conductor layer 17 by screen printing so that the elongate printed conductor 12 is formed. In this case also, the total thickness including the conductor layer 17 and the elongate printed conductor 12 is made smaller than 40 μm.

Thus, after printing a gold paste on the whole surface of the surbstrate 1, a conductor layer 17 is formed by an etching process utilizing photolithography. This conductor layer 17 is as thin as 10 μm or less and shaped like a plane plate and, in consequence, a deformation amount in printing can be made as small as possible dependent on the etching precision of the pattern edges. The line c in FIG. 4 represents a relation between the deformation amount in printing and the thickness in this embodiment, where the deformation amount in printing can be decreased to 10 μm/240 mm if the thickness is 5 μm.

In the above described etching process, if a pattern is printed to have a large thickness, the processing time might be prolonged and disadvantages such as lowering of the precision and solve of the essential portions might be involved. Therefore, the etching process can be applied only to the case in which the conductor layer 17 substantially has a thickness of 10 μm or less, or more preferably 5 μm or less.

Figure 10:
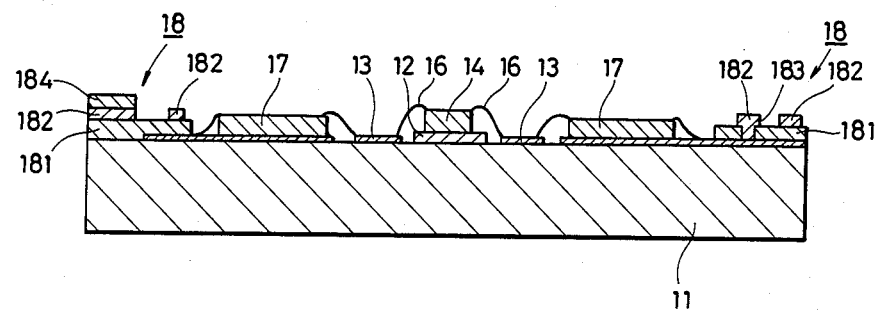
FIG. 10 is a sectional view showing drive devices disposed in the vicinity of a light emitting diode array in accordance with another embodiment of the present invention.
Figure 11:
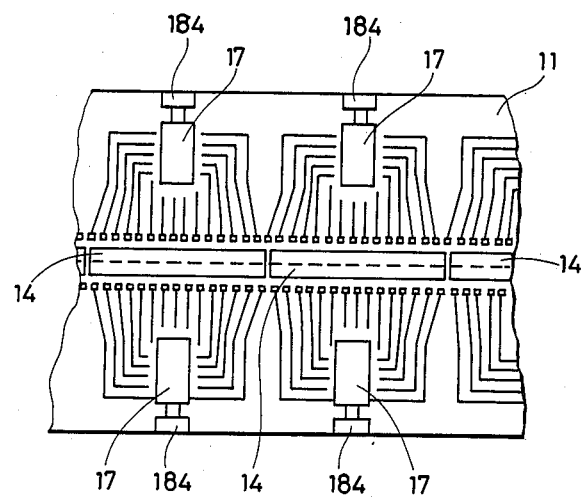
FIG. 11 is a plan view of an essential portion of the embodiment shown in FIG. 10.

FIG. 10 shows another embodiment of the present invention, representing a sectional view of a substrate where a drive circuit is disposed in the vicinity of light emitting diode arrays and FIG. 11 is a top plane view of this embodiment.

In the embodiment shown in FIGS. 10 and 11, drive devices 17 for enabling light emitting diode arrays 14 are provided in the vicinity of the light emitting diode arrays 14 and multilayer connection 18 is provided in the peripheral portions of the substrate 11. More specifically, in the central portion of the substrate 11, the elongate printed conductor 12 is formed and light emitting diode arrays 14 are disposed on the conductor 12, in the same manner as in the above described embodiment shown in FIGS. 2 and 3. Around the elongate printed conductor 12, fine patterns 13 are formed in a manner extending from the vicinity of each emitting diode array 14 to the vicinity of each drive device 17. On the fine patterns 13, any insulating layer must not be formed by baking. This is based on the following two reasons. One reason is that the light emitting diode arrays 14 and the drive devices 17 generate heat, which affects the light emitting diode arrays 14 to cause lowering of the luminance of the light emitting areas 15 as well as deviation of the wavelength of the emitted light. Such changes of the characteristics of the light emitting diode arrays 14 are not desirable since the photosensitive portions facing the light emitting diode arrays 14 in an optical printer are charged or erased according to the peak of the wavelength and the intensity of the light from the light emitting areas 15. Therefore, an approach for improving a radiation effect only in the peripheral portions of the light emitting diode arrays 14 might be considered, but this approach is not desirable since the multilayer connection is liable to have a regenerative effect. The another reason is that the fine pattern 13 has a high density. More specifically, since 8 to 25 light emitting areas 15 are provided for 1 mm as stated above, 4 to 13 lines for 1 mm must be provided as the fine pattern 13 even if they are positioned on both sides of the alignment of the light emitting areas 15 and therefore each connection line is as thin as 50 to 100 μm. Accordingly, if multilayer connection is formed on such fine pattern 13, cracks or rupture would be caused in the fine pattern 13 due to a difference of the thermal expansion coefficient of the fine pattern 13 and that of the multilayer connection. Accordingly, if the surfaces of the fine patterns 13 are to be protected, it is only needed to coat the surfaces with soft silicon resin and the like having a thickness of approximately 10 μm after hardening.

The multilayer connection 18 comprises a lower layer connection obtained by patterning a desired fine pattern 13 to a large width and further comprises an insulating layer 181 thereon having a through hole. This insulating layer 181 is a layer of 10 to 35 μm in thickness formed of a crystallized glass printed material. Further, a conductive layer 182 is formed on the insulating layer 181 and a electrically connected portion 183 as a through hole is formed in the insulating layer 181. The conductive layer 182 is obtained as printed gold paste of 5 to 10 μm in thickness for example and a common connection and a terminal portion are formed in the conductive layer 182. In the terminal portion, a terminal conductor 184 comprised of printed silver palladium paste or the like is provided on the conductive layer 182. Although a baking process is included for formation of the multilayer connection 18, rupture and the like will never occur since the connection layers are sufficiently separated from the light emitting diode arrays 14 to have a size large enough for resisting the baking process. For the purpose of maintaining the radiation characteristics and protecting the connection, it is only necessary to provide the multilayer connection 18 in a position distant from the light emitting diode arrays 14 and not on the fine patterns 13.

Therefore, the multilayer connection 18 needs to be provided on the outer sides with respect to the positions of the drive devices 17, namely, oppositely with respect to the light emitting diode arrays 14.

Figure 12:
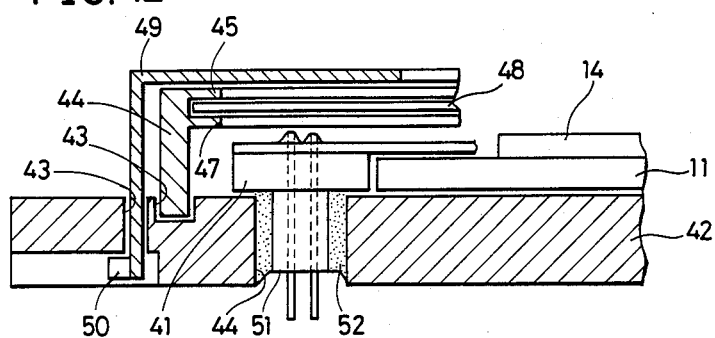
FIG. 12 is a sectional view of an essential portion of an optical printer head where an embodiment of the present invention is applied.
Figure 13:
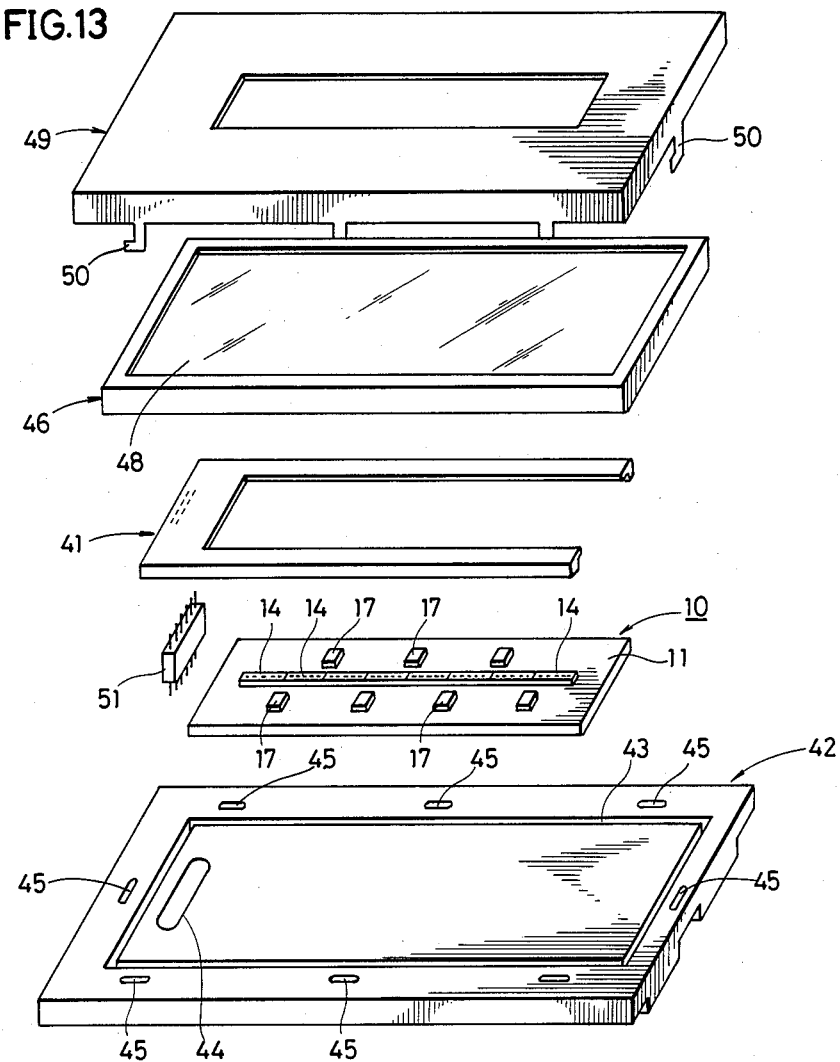
FIG. 13 is a perspective view showing decomposition of the optical printer head shown in FIG. 12.

FIG. 12 is a sectional view of an essential portion of an optical printer head where an embodiment of the present invention is applied and FIG. 13 is a perspective view showing decomposition of this optical printer head.

Now, referring to FIGS. 12 and 13, an optical printer head using the unit 10 of arrayed light emitting diodes shown in FIGS. 2 to 11 will be described. As previously stated, a plate member 41 in the shape of a rectangular frame having an opened side is provided around the unit 10 of arrayed light emitting diodes where light emitting diode arrays 14 and drive devices 17 are disposed on the substrate 11. This plate member 41 has a print pattern to be connected to the substrate 11 of the unit 10 of arrayed light emitting diodes so as to provide paths for lower resistance power supply, common signal and lighting signal. The plate member 41 can be omitted if multilayer connection and terminal can be provided directly on the substrate 11. On the back surface of the unit 10 of arrayed light emitting diodes, a back plate 42 is provided. The back plate 42 comprises radiation plate of aluminum and the like and has a size almost twice as large as that of the substrate 11. In the back plate 42, a through hole 44 is formed in the vicinity of an end of the substrate 11 in the longitudinal direction so that the through hole 44 is blocked by the plate member 41 (or directly by the substrate 11 if the plate 41 is omitted). Further, in the back plate 42, a groove 43 is formed to surround the substrate 11 and the plate member 41 and in the peripheral portions outside the groove 43, a plurality of lock holes 45 are provided at predetermined intervals.

An elastic member 46 is provided to surround the above stated plate member 41. The elastic member 46 has a cut 47 on the front side into which glass 48 is fitted. Further, an outer frame 49 is attached to surround the elastic member 46. This outer frame 49 is a shaped metallic plate having a square hole in a position corresponding at least to the light emitting diode arrays 14. The outer frame 49 has claws 50 at predetermined intervals extending downward to the exterior. These claws 50 are inserted and locked in the lock holes 45 of the back plate 42. A terminal set 51 is for example a 26-pin connector, which is inserted in the through hole 44 of the back plate 42 and fixed to the plate 41 by soldering.

In the following, a method for assembling an optical printer head having the above described construction will be described. First, the plate member 41 is soldered at low temperature to the terminal portion of the substrate 11. Then, the substrate 11 and the back plate 42 are stuck together and the plate member 41 is put onto the substrate 11. To the plate member 41, the terminal set 51 is soldered. After that, the elastic member 46 with the glass 46 is fitted into the groove 43 of the back plate 42. Then, the outer frame 49 is put thereon and by pressing the outer frame 49, the claws 50 are inserted into the lock holes 45 of the back plate 42 and are bent on the back surface of the back plate 42. For doing this bending operation easily, it is desirable to make thin the portions of the lock holes 45 in the back plate 42.

After that, nitrogen gas is made to blow into the through hole 44 if necessary so that seal material 52 such as a silicon adhesive is filled for sealing between the through hole 44 and the terminal set 51. The through hole has a length of 45 mm and a width of 8 mm for example and the terminal set 51 includes a support portion of 38 mm in length and 6 mm in width for example, on which conductive pins are aligned at dual in-line pitches. Since the gas is blown or absorbed aiming at the through hole 44 and the seal material 52 is filled along the inner wall of the through hole 44, the sealing operation can be done easily. For the sealing operation, a perfect airtightness is not required as is different from a conventional type. For example, a state with the air pressure a little lower than the atmospheric pressure and with no ventilation in the atmosphere suffices. Therefore, assembling operation can be made in a dry furnace at 50° to 100° C. and after hardening of the seal material 52, the assembled product can be returned to a place at room temperature.

For decomposition of an optical printer head thus assembled, the claws are set back upright. For reassembling, an opening is provided in the seal material 52 so that the same operation as described above may be done.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A unit of arrayed light emitting diodes comprising: substrate, an elongate printed conductor formed on said substrate, light emitting diode arrays disposed on said elongate printed conductor and having a plurality of light emitting portions on the surface of said light emitting diode arrays, patterns formed on said substrate in the vicinity of said elongate printed conductor, for connecting said light emitting diode arrays, and a multi-layer connection formed on said substrate, said elongate printed conductor having at least one thick film of a thickness of 10 $\mu$m or less, said light emitting portions being arrayed over said plurality of light emitting diode arrays, the arrays of the light emitting portions being substantially parallel to a longer side edge of said elongate printed conductor, said patterns being fine patterns having a density of four lines or more per millimeter, and said multi-layer connection being formed remotely from said elongate printed conductor and not on said fine patterns.

2. A unit of arrayed light emitting diodes in accordance with claim 1, wherein said multilayer connection includes a common connection for said light emitting diode array and a terminal portion.

3. A unit or arrayed light emitting diodes in accordance with claim 1, which further comprises drive devices disposed on said substrate, in the regions between said elongate printer conductor and multilayer connection so as to enable said light emitting diode array by selectively supplying a current to said light emitting portions through said fine patterns.

* * * * *